United States Patent [19]
Joshi et al.

[11] Patent Number: 5,811,847
[45] Date of Patent: Sep. 22, 1998

[54] PSZT FOR INTEGRATED CIRCUIT APPLICATIONS

[75] Inventors: Vikram Joshi; Joseph D. Cuchiaro; Carlos A. Paz de Araujo; Larry D. McMillan, all of Colorado Springs, Colo.

[73] Assignee: Symetrix Corporation, Colorado Springs, Colo.

[21] Appl. No.: 672,421

[22] Filed: Jun. 28, 1996

[51] Int. Cl.$^6$ .................................................. H01L 27/108
[52] U.S. Cl. .......................... 257/296; 257/295; 257/298; 257/300
[58] Field of Search .................................. 257/295, 296, 257/298, 300

[56] References Cited

U.S. PATENT DOCUMENTS

| | | | |
|---|---|---|---|
| 4,514,441 | 4/1985 | Alexander | 427/126.6 |
| 4,647,836 | 3/1987 | Olsen | 322/2 A |
| 4,946,710 | 8/1990 | Miller et al. | 427/126.3 |
| 5,112,433 | 5/1992 | Dawson et al. | 156/623 |
| 5,453,262 | 9/1995 | Dawson et al. | 423/593 |
| 5,453,316 | 9/1995 | Morii et al. | 428/210 |
| 5,471,721 | 12/1995 | Haertling | 29/25.35 |
| 5,644,184 | 7/1997 | Kucherov | 310/306 |

FOREIGN PATENT DOCUMENTS 63-282123   11/1988   Japan.

OTHER PUBLICATIONS

Melnick, et al.; "Process Optimization and Characterization of Device Worthy Sol–Gel Based PZT for Ferroelectric Memories;" Ferroelectrics, 1990; vol. 109.

Moulson, et al.; Electroceramics–Materials–properties–applications; 1990; "6.3 General Characteristics and Fabrication of PZT"; pp. 276–284.

Primary Examiner—Carl W. Whitehead
Attorney, Agent, or Firm—Duft, Graziano & Forest, P.C.

[57] ABSTRACT

An integrated circuit memory, MMIC, or other device including a dielectric comprising lead-tin zirconium-titanium oxide (PSZT). The proportion of tin ranges from 30% to 50% of the total amount of tin, zirconium and titanium. The dielectric is formed by applying a first liquid precursor having 10% excess lead to a substrate and heating it to form a first PSZT thin film, applying a second liquid precursor having 5% excess lead to the first thin film and heating to form a second thin film, then applying the first liquid precursor and heating to form a third thin film, and annealing the three thin films together to form a PSZT dielectric layer.

9 Claims, 5 Drawing Sheets

PSZT FOR INTEGRATED CIRCUIT APPLICATIONS

BACKGROUND OF THE INVENTION

1. Field of the Invention

The invention in general relates to high dielectric constant materials for use in integrated circuits, and more particularly to a layered structure using tin-doped PZT which has unusually excellent properties for use as an integrated circuit capacitor and for other thin-film electronic devices.

2. Statement of the Problem

Lead-zirconate-titanate, usually called PZT, is a well-known material used in integrated circuits. See, for example, U.S. Pat. Nos. 5,028,455 and 4,946,719 issued to William D. Miller et al., and B. M. Melnick, et al., "Process Optimization and Characterization of Device Worthy Sol-Gel Based PZT for Ferroelectric Memories", in *Ferroelectrics,* Vol 109, pp. 1–23 (1990). It is usually applied in an integrated circuit as a ferroelectric.

It is well-known that there has also been a need for a high dielectric constant material suitable for use in integrated circuits. The most commonly used dielectric material in integrated circuits is silicon dioxide, which has a dielectric constant of about 4. Capacitors using such a material must have a large area in order to provide the capacitive values required in state-of-the-art integrated circuits. These large areas make it difficult to reach high densities of capacitive components in an integrated circuit. However, the use of other materials to provide the dielectric in integrated circuits has been hindered by the fact that materials with high dielectric constants usually have many problems such as: leakage of the dielectrics in the integrated circuit environment, degradation and breakdown of the materials caused by the stresses of fabrication and use over long time periods, and incompatibility of the materials with other common integrated circuit materials. As integrated circuits become smaller, this lack of a suitable high dielectric constant material becomes more and more significant. It is considered to be one of the serious roadblocks to higher density integrated circuit memories.

SUMMARY OF THE INVENTION

The present invention solves the above problem by providing a high dielectric constant material comprising tn-doped PZT. The molecular amount of tin in the PZT can range from about 10% of the molecular amount of lead to 50% of the molecular amount of lead. Since the amount of tin in the compounds according to the invention is of the same order as the amount of zirconium and titanium, the material could also be called PSZT, which is how we shall refer to it herein. In the preferred compounds, the amount of tin is larger than the amount of zirconium and the amount of titanium.

The PSZT material according to the invention is preferably made using a liquid precursor containing lead, zirconium, titanium and tin compounds in a solvent. The metal compounds are preferably hexanoates or acetates. The solvent is preferably xylenes, 2-methoxyethanol, or a combination thereof. A thin film of the liquid precursor is applied to a substrate and then heated to form a thin film of solid PSZT. Preferably the liquid precursor includes an excess amount of lead.

The invention also includes a layered insulator structure comprising a plurality of thin-film layers of PSZT. Preferably there are at least three layers, with the precursors used in forming the outermost of the layers containing a greater amount of excess lead than the precursors used in forming the inner layers.

The preferred precursor for the outermost layers has a molecular ratio of lead to zirconium to titanium to tin of 1.10/0.25/0.35/0.40, while the inner layers are made with a precursor having a molecular ration of 1.05/0.25/0.35/0.40. In the foregoing sentence, the notation 1.10/0.25/0.35/0.40, indicates that the ratio of the lead, tin zirconium and titanium is such that a PSZT material of the formula $Pb_{1.10}Sn_{0.40}Zr_{0.25}Ti_{0.35}O_3$ would result from the precursor if all the metal remained during processing. However, as will be seen in more detail below, heating during processing causes lead to escape as lead oxide, which is much more volatile than the other oxides formed in the precursor. Since all the lead does not remain during the thin film preparation process, we shall herein refer the material fabricated from a precursor with the molecular ratio 1.10/0.25/0.35/0.40 as 25/35–40 with 10% excess lead. That is, the ratio of zirconium to titanium is given first followed by a dash then the molecular proportion of tin followed by a statement of how much excess lead is used in the precursor. Thus, 55/25–20 with 5% excess lead implies a molecular formula of $Pb_{1.05}Sn_{0.20}Zr_{0.55}Ti_{0.25}O_3$ if all the lead remained after heating.

The invention provides an integrated circuit comprising a plurality of thin film layers, one of the layers comprising a high dielectric constant insulator comprising a metal oxide including the metals lead, zinc, titanium, and tin. Preferably, the molecular proportion of tin ranges from 30% to 50% of the total amount of tin, zinc and titanium. Preferably, the metal-oxide has the formula $Pb_xSn_yZr_zTi_{1-(y+z)}O_3$, where x=1 to 1.1, y=0.30 to 0.50, and z=0.15 to 0.35. Preferably, the thickness of the layer of metal oxide ranges from 1000 angstroms to 5000 angstroms. Preferably, the integrated circuit includes a capacitor having a first electrode, a second electrode, and a dielectric between the first and second electrodes, and wherein the dielectric comprises the metal-oxide. Preferably the integrated comprises an electronic devices that includes the metal oxide. Preferably, the electronic device comprises a device selected from the group consisting of a MMIC and a memory cell.

The invention also provides an integrated circuit memory comprising a plurality of thin film layers, one of the layers comprising a high dielectric constant insulator comprising a metal oxide including the metals lead, zinc, titanium, and tin.

In another aspect, the invention provides a process for making an integrated circuit comprising: preparing a liquid precursor including the metals lead, zinc, titanium, and tin; applying the liquid precursor to a substrate; and heating the substrate to form a metal oxide including the metals. Preferably, the molecular proportion of tin in the precursor ranges from 30% to 50% of the total molecular amount of tin, zinc and titanium. Preferably, the molecular proportion of lead in the precursor ranges from 100% to 120% of the total molecular amount of tin, zinc, and titanium. Preferably, the step of preparing a liquid precursor comprises: preparing a first liquid precursor having a first molecular proportion of lead, and forming a second liquid precursor having a second molecular proportion of lead, the second molecular proportion of lead being greater than the first molecular proportion; the steps of applying and heating comprise: applying the second precursor to the substrate and heating it to form a first thin film, applying the first precursor to the substrate and heating it to form a second thin film overlying the first thin film, and applying the second precursor to the substrate and heating it to form a third thin film overlying the second thin film, whereby the second thin film is located between the first and third thin films; and the step of heating further comprises annealing the first, second and third thin films together to form the metal-oxide. Preferably, the second molecular proportion of lead comprises from 105% to 120% of the total molecular amount of tin, zinc, and titanium in the second precursor. Preferably, the second molecular proportion of lead comprises 110% of the total molecular amount of tin, zinc, and titanium in the second precursor, and the first molecular proportion of lead comprises 105% of the total molecular amount of tin, zinc, and titanium in the first precursor. Preferably, the process includes the step of completing the integrated circuit to include the metal oxide in an electronic device in the integrated circuit. Preferably, said step of completing comprises completing the integrated circuit to include the metal oxide in an electronic device selected from the group consisting of an MMIC and a memory cell.

The PSZT material according to the invention has a dielectric constant of over one thousand and a leakage current of less than $10^{-7}$ amps per square centimeter for a film thickness of about 3200 angstroms. Numerous other features, objects and advantages of the invention will become apparent from the following description when read in conjunction with the accompanying drawings.

DESCRIPTION OF THE PREFERRED EMBODIMENT

Figures 2, 3:
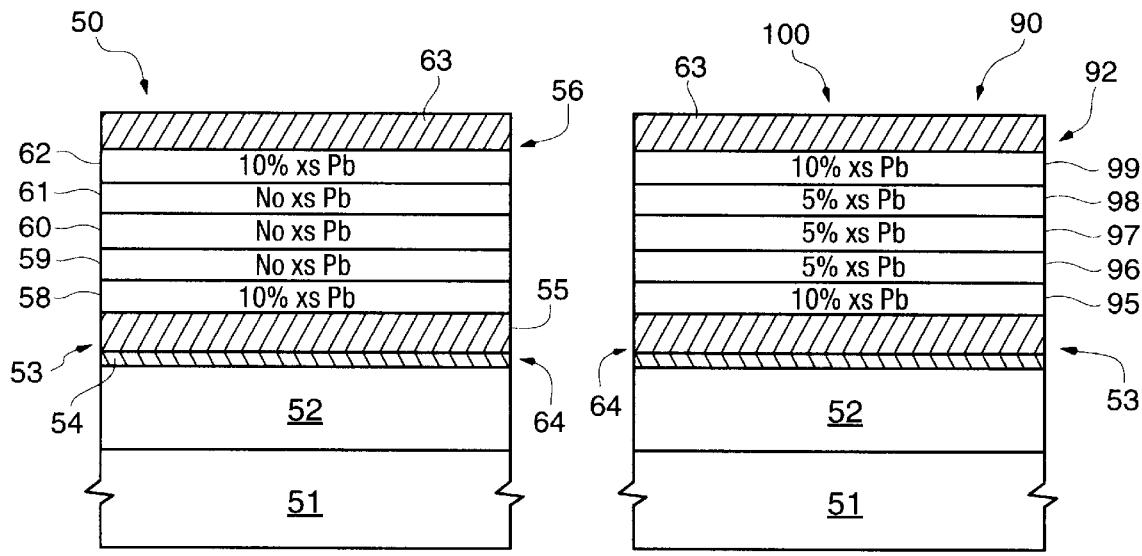
FIG. 2 is a cross-sectional views of one embodiment of an integrated circuit capacitor according to the invention.
FIG. 3 is a cross-sectional view of the preferred embodiment of an integrated circuit capacitor according to the invention.
Figure 4:
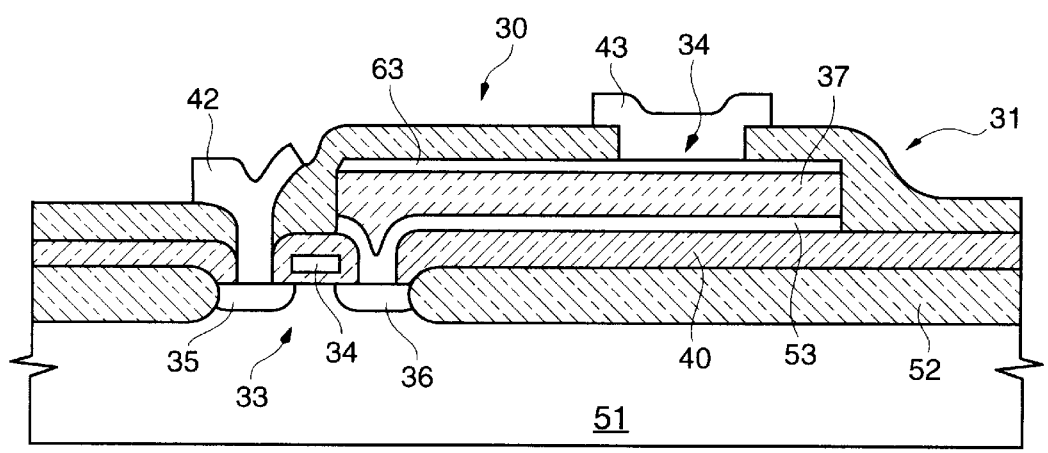
FIG. 4 is a cross-sectional view of a DRAM cell in which the integrated circuit capacitors of FIGS. 2 and 3 may be incorporated.

Directing attention to FIG. 2, there is shown a cross-sectional view of an integrated circuit capacitor according to the invention. It should be understood that FIGS. 2 and 3 depicting integrated circuit capacitor devices and FIG. 4 depicting an integrated circuit DRAM are not meant to be actual plan or cross-sectional views of any particular portion of an actual capacitor or integrated circuit device. In the actual devices, the layers will not be as regular and the thickness may have different proportions. The figures instead show idealized representations which are employed to more clearly and fully depict the structure and process of the invention than would otherwise be possible. Integrated circuit capacitor 50 is preferably formed on a wafer 51 that may be silicon, gallium arsenide or other semiconductor, or an insulator, such as glass. In the preferred embodiments described herein, it is a P-type silicon wafer of about 100 centimeters in diameter. A layer 52 of about 5000 Å of silicon dioxide is grown on the silicon wafer 51 by conventional methods. Then the first electrode 53 is formed by first sputtering 200 Å of titanium 54 followed by 2000 Å of platinum 55. As is known in the art, the titanium assists in adhering the platinum to the oxide 52. The incomplete device is then annealed in an oxygen furnace, preferably for 30 minutes at 650° C. Next the PSZT insulator 56 is formed on the substrate 64, as will be described in detail below. In the capacitors of FIGS. 2 and 3, the PSZT insulator 56 comprises five layers, such as layers 58–62 of FIG. 2, of PSZT of varying compositions, which also will be described in detail below. Then, the second electrode 63 is formed, preferably by sputtering another 2000 Å thick layer of platinum. Further details of the capacitor formation process will be described below.

An DRAM (Dynamic Random Access Memory) cell 30 in which the capacitors 50, 90 according to the invention may be used is shown in FIG. 4. The cell 30 is formed on a silicon substrate 51, and includes field oxide areas 52, and two electrically interconnected electrical devices, a transistor 33, and a capacitor 34, the latter of which may be either the capacitor 50 or the capacitor 90. Transistor 33 includes a gate 34, a source 35, and a drain 36. Capacitor 34 includes first electrode 53, dielectric layer 37, which may be either layers 56 or layers 92, and second electrode 63. The first electrode is shown as a single element because of the scale of the drawing, though it should be understood that it will usually comprise two or more different layers, as discussed above. Insulators, such as 40, separate the devices 33 and 34, except where drain 36 of transistor 33 is connected to first electrode 53 of capacitor 34. Insulators 40 may also be made of the PSZT material according to the invention. Electrical contacts, such as 42 and 43 make electrical connection to the devices 33 and 34 and to other parts of the integrated circuit 31.

Another integrated circuit in which the PSZT material according to the invention can be applied is in a monolithic microwave integrated circuit (MMIC). In a MMIC, active and passive components of a microwave circuit, as well as interconnections are formed on a single substrate. The components of a MMIC in which the PSZT may be used include capacitors, such as shown in FIGS. 2 and 3, and FETs, such as 33 in FIG. 4, as well as other components. In some simple cases, and MMIC 100(FIG. 3) may consist of one or more capacitors, 90.

Figure 1:
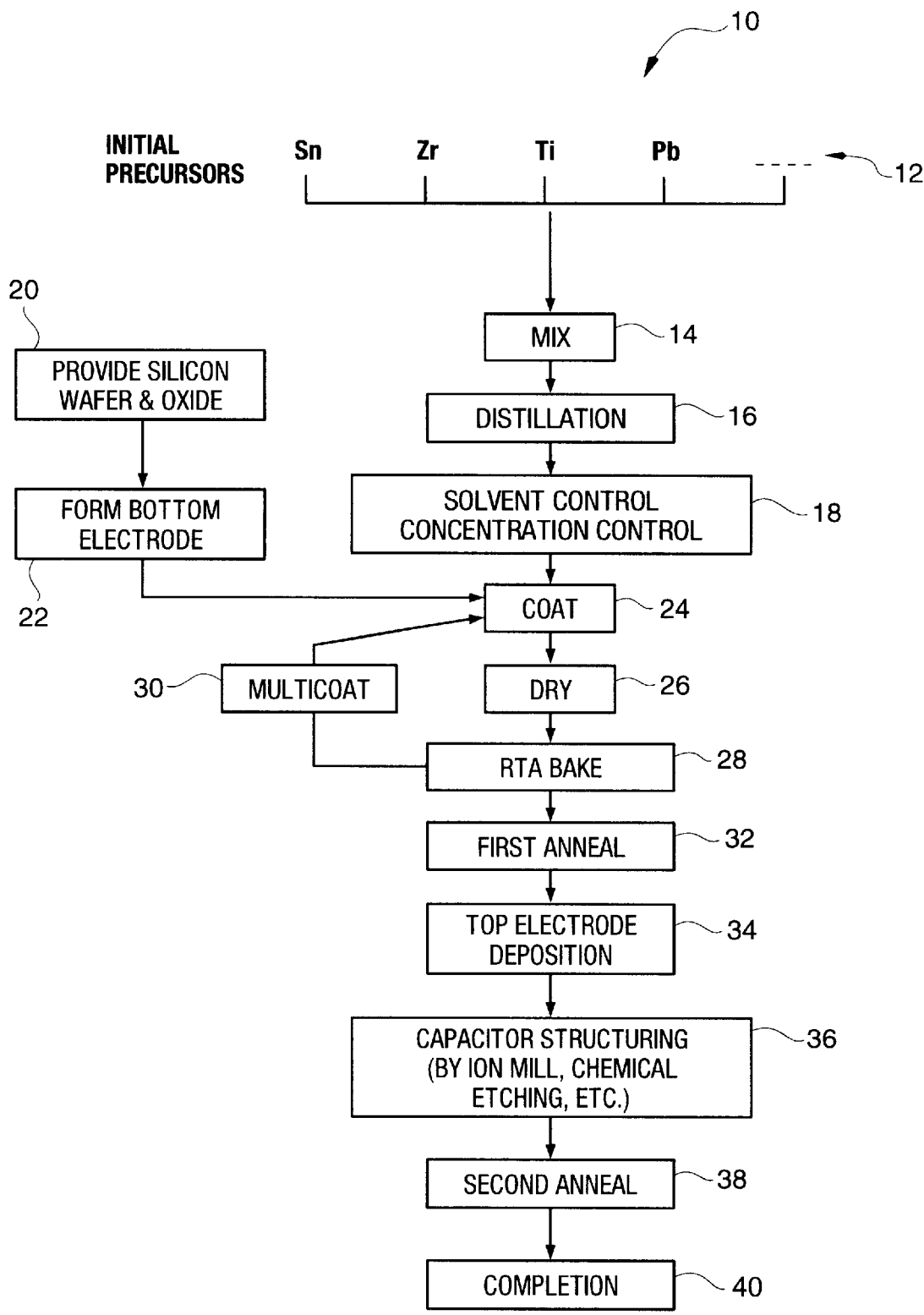
FIG. 1 is a flow chart showing the preferred embodiment of a process for forming a capacitor including a PSZT insulator according to the invention.

Directing attention to FIG. 1, there is shown a flow chart of a generalized process 10 according to the invention for forming an integrated circuit capacitor 50, 90 (FIGS. 2–3). The process begins with the formation of a precursor solution, in steps 12 through 18, and the preparation, in steps 20 and 22, of the substrate 64 to which the precursor solution is to be applied. Both the words "substrate" and "precursor" are used ambiguously in the art. The word "substrate" can mean the underlying wafer 51 on which the integrated circuit is formed as well as any object on which a thin film layer is deposited. In this disclosure "substrate" shall mean the object to which the layer of interest is applied; for example, when we are talking about an PSZT insulating layer, such as 56, the substrate 64 includes the layers 51, 52, 54 and 55 on which the PSZT layer is formed. In the art, the word "precursor" can mean a solution containing one metal which is mixed with other "precursors" to form the solution to be applied to the substrate, or the solution which is applied to a substrate. In this discussion, we shall generally refer to the individual precursors that are mixed to form the solution that is applied to the substrate as "initial precursors" and the precursor as applied to the substrate as the "final precursor" or just "precursor" unless some other meaning is clear from the context. In intermediate stages the solution may be referred to as the "intermediate precursor".

The term "thin film" is used herein as it is used in the integrated circuit art. Generally it means a film of less than a micron in thickness. The thin films disclosed herein are in all instances less than 0.5 microns in thickness. These thin films of the integrated circuit art should not be confused with the layered capacitors of the macroscopic capacitor art which are formed by a wholly different process which is incompatible with the integrated circuit art.

In step P12 the initial precursors are formed. These may be formed by interacting the metal or an alkoxide of the metal with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include: xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal carboxylate and/or metal-alkoxide, which mixture is heated and stirred as necessary to form metal-oxygen-metal bonds and boil off any low-boiling point organics that are produced by the reaction. The individual precursors for Sn, Zr, Ti, and Pb are cold mixed in step 14. Optionally, additional solvent, indicated by the dotted line in step 12, may be added also. This mixed precursor prepared in step 14 is preferably the final precursor. However, optionally, the mixture may be further heated to distill it, or, in step 18 an additional solvent or solvents may be added just before application of the precursor to adjust the concentration to be optimum for the particular thin film to be formed. For example, n-butyl acetate may be added to adjust the viscosity and boiling point, or a solvent exchange step may take place simultaneously with or subsequently to the concentration adjustment, which solvent exchange step replaces one solvent with a second solvent.

In steps 20 and 21 a substrate is provided. The substrate generally would be an incomplete integrated circuit, or other electrical device. In the preferred embodiment the substrate 64 comprises a P-type silicon wafer 51, a layer 52 of silicon oxide, and the bottom electrode 53, which as described above, includes an adhesion layer 54 of titanium and a layer 55 of platinum. In addition, it may include a barrier layer of, for example, TiN. The barrier layer prevents ion migration between the silicon of layer 52, the platinum, 55, and layers 58–62 of PSZT. The structure of such adhesion layers, barrier layers, and electrodes is well know in the art and will not be discussed in detail herein.

An alternative process step 12 of preparing the precursor is performed using an acetate-based process. In this process, tin acetate, zirconium acetate, titanium acetate, and lead acetate are reacted and dissolved in an acid and an alcohol, preferably acetic acid and methoxyethanol. Preferably the acetic acid is added to the zirconium acetate, followed by the methoxyethanol, then the zirconium acetate, the titanium acetate, and the lead acetate. A detailed example of the process is given below.

In step 24 the final precursor is applied to the substrate 64. The application may be by a misted deposition process as described in U.S. Pat. No. 5,456,945 issued Oct. 10, 1995, though other methods of applying a liquid to a substrate may be used. Preferably, a spin-on process is used. Preferably the wafer is spun at a spin rate of between 750 RPM and 6000 RPM for a period of 5 seconds to a minute, with these parameters depending on the concentration and viscosity of the solution being applied and the desired thickness of the resulting layer. In the examples below, the final precursor was applied to the substrate spinning at 2000 rpm for a period of 30 seconds. In steps 26–32, the precursor on the substrate is then treated, to form a solid metal oxide thin film. Generally it is treated by heating, but as described in U.S. Pat. No. 5,456,945 referenced above, it may alternatively or additionally be treated by exposing the substrate and precursor to a vacuum. In the preferred embodiment, the precursor is treated by drying in step 26, baking in step 28, and annealing in step 32. The drying step 26 is done at a temperature of between 100° C. and 350° C. for a time of between 30 seconds and 10 minutes, preferably on a hot plate. Preferably, the drying is done in a plurality of drying steps, each one at a higher temperature than the previous one. In the samples below, the drying was preferably done in two steps, one at 160° C. for one minute and another at 260° C. for four minutes. The bake step 28 is preferably a rapid thermal "anneal" (RTA) bake, though it may be a hot plate bake or an oven or furnace bake. Preferably, the RTA step 28 utilizes a halogen light source to raise the wafer rapidly to a high temperature in the range from 500° C. to 850° C. for a bake time of between 15 seconds and 3 minutes. In the examples below, the samples were ramped at 100° C./second up to 650° C. where they were held for 30 seconds. The step 32 of annealing is done at a temperature 500° C. to 850° C. for from 30 minutes to three hours. In the examples below, the annealing was done at 700° C. for 60 minutes with a five minute push into the furnace and a five minute pull out of the furnace. If a single coat of precursor is applied, the drying step 26, the baking step 28, and the annealing step 32 are performed consecutively. However, usually two or more coats (layers) of PSZT are formed. In a multiple coat process 30, the drying step 26 and the bake step 28 are performed after each application of the precursor, and then the next coat of precursor is applied. The anneal step 32 is preferably performed after all the coats of PSZT are applied.

After the desired number of coats of precursor are applied, dried, baked, and annealed, the top electrode 63 is deposited in step 36, preferably by sputtering a layer of platinum. Then, in step 36, the capacitor is patterned in a conventional process, such as ion milling, chemical etching, etc. In the examples below, an ion milling process with a negative photo lithographic mask was used. The milling time was between 24 and 29 minutes depending on the sample. The a resist strip was performed using a standard IPC with 350 watts of RF power for 40 minutes. Then, in step 38, a second anneal is performed. The second anneal is at a temperature of between 500° C. to 850° C. for between 15 minutes to one hour. In the examples below, the annealing was done at 700° C. for 30 minutes with a five minute push into the furnace and a five minute pull out of the furnace. Finally, in step 40 the integrated circuit is completed using conventional processes.

Turning now to specific examples of the invention, examples of the process of preparing the precursors according to the invention and processes according to the invention utilizing the precursors to form capacitor devices are given below. All processes were performed at the atmospheric pressure in Colorado Springs, Co., except where otherwise noted.

In examples 1A and 1B an acetate process was used. In this process the, initial precursors were the acetates of lead, tin, zirconium and titanium. The final precursor was made by adding acetic acid to the tn acetate, dissolving the reactant in methoxyethanol, then adding zirconium acetate, titanium acetyl acetate and lead acetate.

EXAMPLE 1A

A final precursor was made by adding 2.0 grams of acetic acid to 0.52 grams of Sn acetate, adding 10.0 grams of methoxyethanol, then 0.52 grams of Zr acetate, 0.63 grams of titanium acetyl acetate, and 1.04 grams of Pb acetate. This formed a 25/35–40 intermediate precursor. An additional 0.105 grams of lead were added to form a final precursor with 10% excess lead. Referring to FIG. 3, a first layer 95 of PSZT was formed on a substrate 64 then dried and baked in steps 26 and 28, respectively. Then, again using the intermediate precursor described above, 0.05025 grams of lead acetate were added to form a 25/35–40 precursor with 5% excess lead was made and three more layers 96–98 were formed. Then another layer was formed using the 25/35–40 precursor with 10% excess lead. The incomplete device was annealed in step 32 to form the PSZT layer 92 followed by the deposition of the top electrode, patterning in step 36, and the second anneal of step 38. The completed device had a total PSZT film 92 thickness, i.e. layers 95–99, of 1850 Angstroms (Å) and an area of 7850 square micrometers.

The capacitor 90 was found to be a paraelectric with a high dielectric constant capacitor. The capacitance as a function of bias frequency was measured and was found to decrease only about 6% from 100 hertz to a million hertz for low amplitude signals, i.e. about 10 micro volts rms, about 12% over the same range for an amplitude of 30 mV rms, and 20% for an amplitude of 100 mv rms over the same range. The capacitance versus bias voltage curve peaked sharply at abut 500 picofarads at zero volts with excellent repeatability. This corresponds to a dielectric constant of about 1331. The leakage current was under $10^{-7}$ amps/centimeter$^2$ out to about 5 volts then rose slightly and stayed on the order of about $10^{-7}$ amps/centimeter$^2$ out to about 10 volts. These are all excellent results, indicating a stable, high dielectric constant capacitor very useful for integrated circuit applications.

EXAMPLE 1B

A second capacitor was made as in example 1A except having an area of 17700 micrometers. This had almost identical properties as the capacitor of Example 1D, except higher capacitance as expected.

Figure 5:
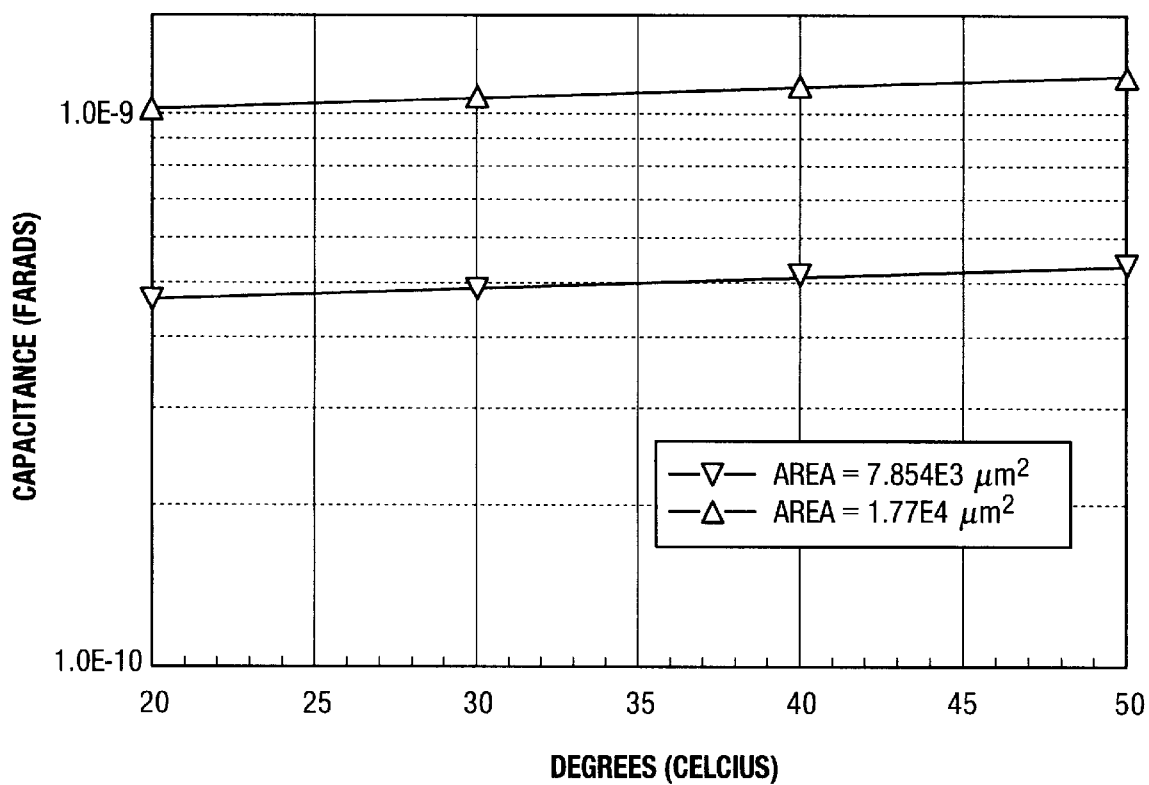
FIG. 5 is a graph of capacitance versus temperature for integrated circuit capacitors with the cross-section of FIG. 3 having two different capacitor areas.

The capacitance versus temperature was measured for both the capacitor of Example 1A and the capacitor of Example 1B. The results are shown in FIG. 5. The ratio of the capacitances is within 2% of the ratio of the areas, indicating that the electronic properties are stable as the area of the capacitors change. The capacitance is also very flat over the range from 20° C. to 50° C., the range of normal usage for an integrated circuit capacitor. Thus, the capacitors according to the invention have performance properties better than any commercially available integrated circuit capacitor available today.

A second series of capacitors were made with an EMOD (Ethylhexanote Metal-Organic Deposition) cold-mixed process. That is, metal-2-ethylhexanoate initial precursors were mixed at room temperature (293° K.) to make the final precursor. In examples 2A through 2D the initial precursors for the lead, tin, zirconium and titanium initial precursors were made as follows. Referring to FIG. 1, in step 12 the compounds shown in Table I were measured.

TABLE I

| Compound | FW | g | mmol | |
|---|---|---|---|---|
| lead 2-ethylhexanoate | 493.61 | 12.080 | 24.473 | Strem |
| tin 2-ethylhexanoate | 406.11 | 6.4963 | 16.036 | Aldrich |
| zirconium n-propoxide 70% in propanol | 467.94 | 112.306 | 240.00 | Morton-Thiokol |
| 2-ethylhexanoic acid | 144.21 | 145.36 | 1008.0 | Aldrich |
| Titanium Isopropoxide | 284.26 | 42.641 | 150.01 | Johnson-Mathey |
| 2-ethylhexanoic acid | 144.21 | 90.891 | 630.27 | Aldrich |

In the above table and the tables below, "FW" indicates formula weight, "g" indicates grams, "mmoles" indicates millimoles, and "Vendor" indicates the company from which the chemical was purchased. The lead 2-ethylhexanoate was mixed with 35 milliliters (ml) of xylenes in a beaker. In this disclosure, "xylenes" indicates a commercially available xylene solution which includes the three different isomers of xylene. The mixture was heated to dissolve the lead 2-ethylhexanoate, then 6 milliliter of 2-ethylhexanoate acid was added as a co-solvent. The solution was diluted to 48.945 grams with additional xylenes. This resulted in an initial precursor solution of 0.50001 mmoles of lead per gram.

The tin 2-ethylhexanoate was dissolved in xylenes in a sufficient amount to make 40.003 grams of solution. This resulted in an initial precursor solution with a concentration of 0.4009 mmole of tin per gram.

The zirconium n-propoxide and the 2-ethylhexanoic acid listed below it in Table I were placed in a beaker with 50 ml of xylenes. The mixture was heated and stirred on low heat of about 115° C. for 6.5 hours. The heat was then raised to cause the propanol and water to distill from the solution, during which heating 100 ml of additional xylenes were added. The maximum temperature reached was 126° C. The final mass was 242.13 grams, producing a solution with a concentration of 0.9912 mmoles of zirconium per gram.

The titanium isopropoxide and the second measure of 2-ethylhexanoic acid were placed in a beaker with 100 ml of 2-methoxyethanol and stirred on medium heat, i.e a temperature of about 118° C., for 18.5 hours. About 200 ml of xylenes were added and the heat was raised, allowing all isopropanol and 2-methoxyethanol to distill out. The maximum temperature reached was 126° C. The solution was diluted to 500 ml with additional xylenes. This resulted in an initial precursor with a concentration of titanium molarity of 0.300M.

EXAMPLE 2A

The four initial EMOD precursors described above were cold mixed at room temperature in suitable volumetric proportions to produce a 55/25-20 precursor with 10% excess lead. Referring to FIG. 2, a first layer 58 of PSZT as formed by the spin-on process discussed above with respect to FIG. 1. Then, after this layer was dried and baked in steps 26 and 28, respectively, a precursor having the 55/25-20 molecular ratio with no excess lead was cold-mixed and three more layers, 59–62 were formed in steps 24–30. Then, another layer 62 was formed with the 55/25-20 precursor with 10% excess lead. The incomplete device was annealed in step 32 as described above to form the PSZT layer 56, then a top electrode 63 was a formed, followed by the patterning as described above with reference to step 36. Then the capacitor 50 was annealed again in step 38 with the preferred temperatures and times given above.

This capacitor was tested and found to be ferroelectric.

EXAMPLE 2B

The initial EMOD precursors formed as described above were cold-mixed at room temperature in step 14 in suitable proportions to form a 55/25-20 precursor with 10% excess lead. Referring to FIG. 3, a first layer 95 of PSZT was formed on a substrate 64 then dried and baked in steps 26 and 28, respectively. Then, again using the initial precursors described above, a 55/25-20 precursor with 5% excess lead was cold-mixed in step 14 and three more layers 96–98 were formed. Then another layer was formed using the 55/25-20 precursor with 10% excess lead. The incomplete device was annealed in step 32 to form the PSZT layer 92 followed by the deposition of the top electrode, patterning in step 36, and the second anneal of step 38.

This capacitor was also found to be ferroelectric.

EXAMPLE 2C

The initial EMOD precursors were cold-mixed at room temperature in step 14 in suitable proportions to form a 25/35–40 precursor with 10% excess lead. Referring to FIG. 2, a first layer 58 of PSZT was formed on a substrate 64 then dried and baked in steps 26 and 28, respectively. Then, again using the initial precursors described above, a 25/35–40 precursor with no excess lead was cold-mixed in step 14 and three more layers 59–61 were formed. Then another layer was formed using the 25/35–40 precursor with 10% excess lead. The incomplete device was annealed in step 32 to form the PZT layer 56, followed by the deposition of the top electrode 63, patterning in step 36, and the second anneal of step 38. The completed device had a total PSZT film 56 thickness, i.e. layers 58–62, of 3070 Angstroms (Å) and an area of 7850 micrometers$^2$.

Figure 6:
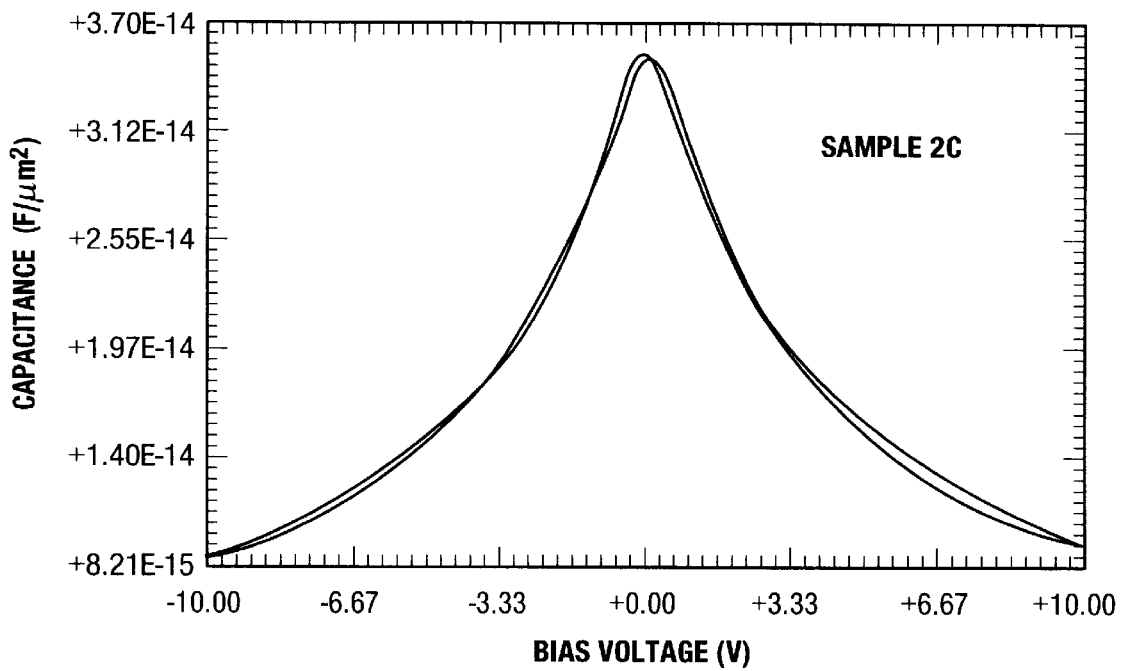
FIG. 6 is a graph of the measured capacitance versus bias voltage for a capacitor having the cross-section of FIG. 2.
Figure 8:
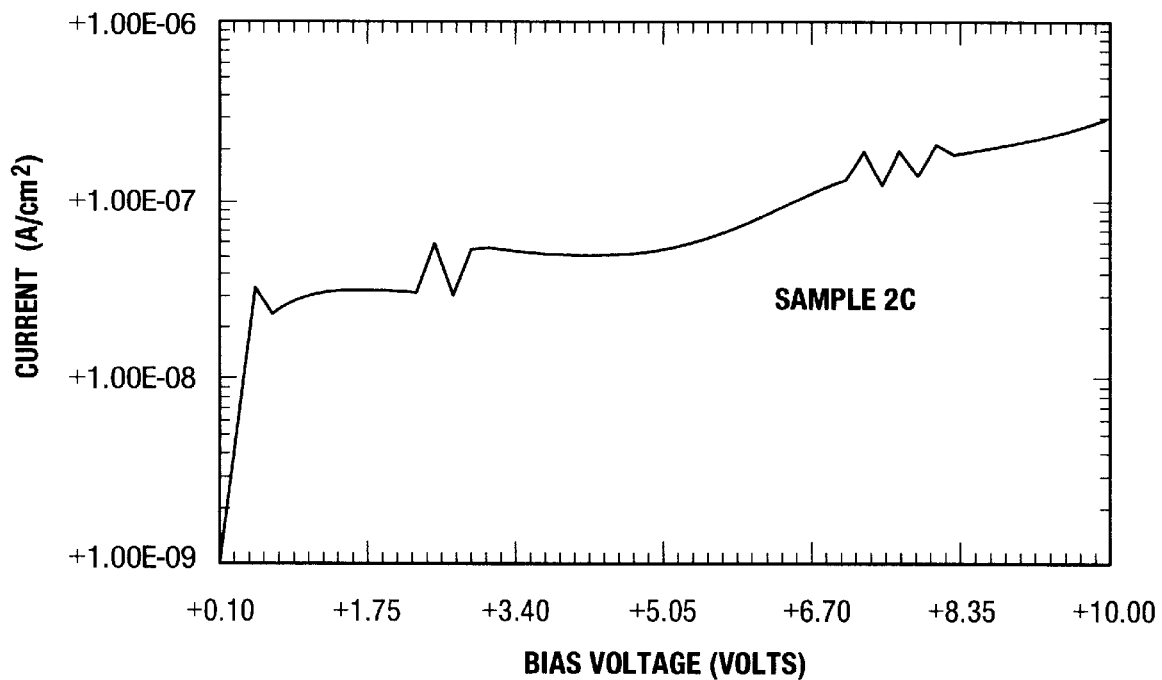
FIG. 8 is a graph of the measured leakage current versus bias voltage for a capacitor having the cross-section of FIG. 2.

The capacitance as a function of frequency was measured at 293° K., an oscillation frequency of $10^5$ Hertz and amplitude of 0.026 volts with a dwell time of 0.5 seconds, in 0.2 volts bias voltage increments, from −10 volts to +10 volts and then back down to −10 volts. The capacitance in farads per square micrometer versus bias voltage in volts is shown in FIG. 6. The results show a large capacitance density at zero bias, which can be increased by at least a factor of two by decreasing the film thickness. It also shows a dielectric constant of greater than 1300. These results indicate a high quality device capable of withstanding large DC fields of the order of 540 kilovolts/cm$^2$ without breakdown. The leakage current as a function of bias voltage was also measured with the results plotted in FIG. 8 with the leakage current in amperes per square centimeter and the voltage in volts. For bias voltages in the range of conventional memory voltages, i.e 2 to 5 volts, the leakage current stays well below $10^{-7}$ amps per square centimeter. All the properties described above are very important for applications such as DRAMs.

EXAMPLE 2D

The initial EMOD precursors were cold-mixed in step 14 in suitable proportions to form a 25/35–40 precursor with 10% excess lead. Referring to FIG. 3, a first layer 95 of PSZT was formed on a substrate 64 then dried and baked in steps 26 and 28, respectively. Then, again using the initial precursors described above, a 25/35–40 precursor with 5% excess lead was cold-mixed in step 14 and three more layers 96–98 were formed. Then another layer was formed using the 25/35–40 precursor with 10% excess lead. The incomplete device was annealed in step 32 to form the PSZT layer 92 followed by the deposition of the top electrode, patterning in step 36, and the second anneal of step 38. The completed device had a total PSZT film 92 thickness, i.e. layers 95–99, of 3200 Angstroms (Å) and an area of 7850 micrometers$^2$.

Figure 7:
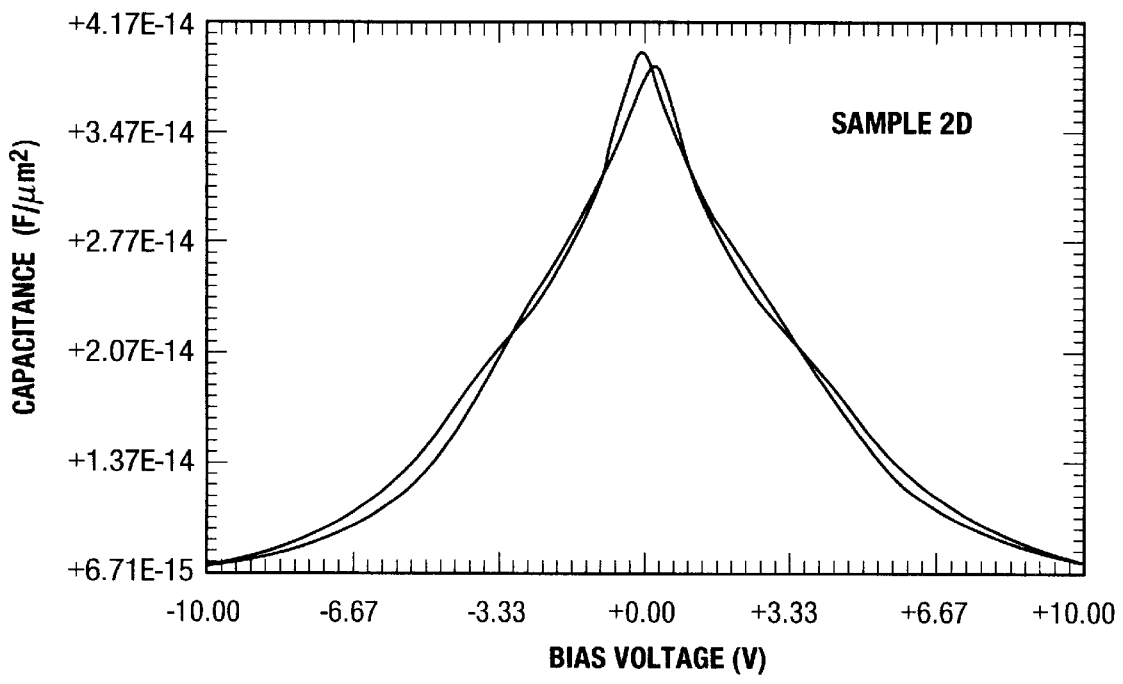
FIG. 7 is a graph of the measured capacitance versus bias voltage for a capacitor having the cross-section of FIG. 3.
Figure 9:
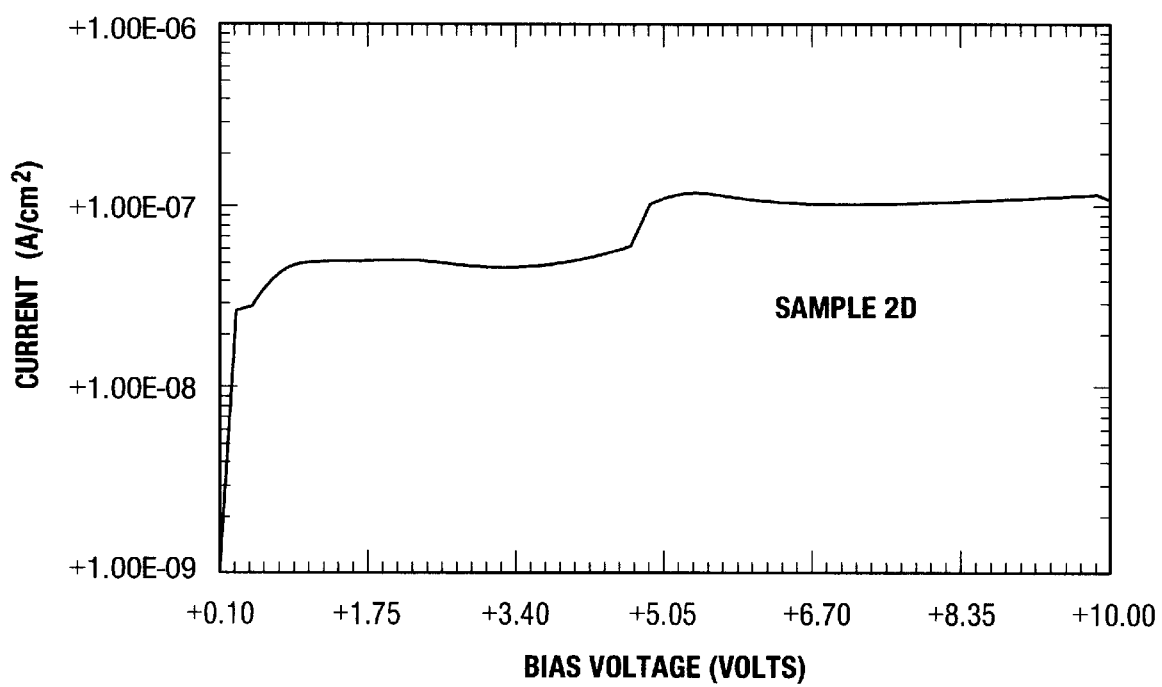
FIG. 9 is a graph of the measured leakage current versus bias voltage for a capacitor having the cross-section of FIG. 3.

The capacitance as a function of frequency was measured at 293° K., an oscillation frequency of $10^5$ Hertz and amplitude of 0.026 volts with a dwell time of 0.5 seconds, in 0.2 volts bias voltage increments, from −10 volts to +10 volts and then back down to −10 volts. The capacitance in farads per square micrometer versus bias voltage in volts is shown in FIG. 7. The results are similar to that for the sample of Example 2D, but the capacitance more sharply peaked, indicating a higher capacitance, some of which is due the greater thickness of the film, but much of which is due to a capacitance density of nearly twice as much as the film of FIG. 6; i.e. at 1850 Å the material of the film of FIG. 7 would be approximately 61.5 ff/micrometer$^2$, while the film of FIG. 6 would have a capacitance density of approximately 36 ff/micrometer$^2$ for the same thickness. However, the roll-off of the capacitance is also greater in the film of FIG. 7, indicating that it is on the phase boundary, i.e. closer to the ferroelectric phase. The leakage current as a function of bias voltage was also measured with the results plotted in FIG. 9 with the leakage current in amperes per square centimeter and the voltage in volts. This result is also even better than the result for the sample of Example 2C, since the leakage current stays relatively flat out to five volts and stays at approximately $10^{-7}$ amps per square centimeter all the way out to 10 volts.

The dielectric constant of the above materials is more than ten times higher than the dielectric constant of silicon dioxide which is the predominant material used as an insulator in state-of-the-art integrated circuits. As known in the art, leakage currents below $10^{-6}$ amps per square centimeter indicate that the dielectric will perform well in an integrated circuit memory. The above results indicate that a PSZT capacitor with the 25/35–40 proportion for the Zn, Ti, Sn and excess lead in the outer layers should perform excellently in integrated circuit memories, and the PSZT material should work well as an insulator in other integrated circuit applications.

Capacitors were also made as described above for a range of tin amounts and it was found that good performance resulted within a range of from about 30 to 50, that is, the molecular proportion of tin to the total amount of tin, zinc and titanium ranged from about 30% to about 50%. It was found that ratios of zirconium to titanium from about 15/45 to about 35/25 appeared to give suitable high dielectric constant results. In terms of the well-known $ABO_3$ formula for metal oxides, material having the formula $Pb_xSn_yZr_zTi_{1-(y+z)}O_3$ where x=1 to 1.1, y=0.30 to 0.50, and z=0.15 to 0.35 appears to give good results.

A feature of the invention is the excess lead in the PSZT precursor, in amounts ranging from 5% to 20%, particularly at the electrode interface with the rest of the integrated circuit. During the heating in the drying, baking, and annealing steps, 26, 28, 32, and 38, lead tends to form lead oxide, which is much more volatile than the oxides of the other metals. Thus, lead tends to escape during the heating steps. The lead tends to escape more readily from the outer layers, thus providing a higher amount of excess lead in the outer layers 62, 58, 99, 95, provides a better result. From the above, it is apparent that the preferred amount of excess lead will depend on the details of the thermal budget. It is believed that the amounts indicated result in a substantially stoichiometric final thin film 56, 92 for the heating steps specified above.

There has been described novel PSZT precursors, novel thin film fabrication methods utilizing these precursors, novel thin film structures, and novel integrated circuit electronic devices utilizing the utilizing the PSZT materials and the novel structures. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that the advantageous use of PSZT material in integrated circuits has been disclosed, the material can be advantageously used as an insulator in other electronic applications, particularly in integrated circuits. It is also apparent that other processes may be used to form the PSZT devices other than the exemplary processes described above. Further, the precursors, processes and structures can be combined with conventional processes to provide variations on the processes and devices described. It is also evident that the process steps recited may in some instances be performed in a different order. Or equivalent structures and process may be substituted for the various structures and processes described. Consequently, the invention is to be construed as embracing each and every novel feature and novel combination of features present in and/or possessed by the precursors, precursor formation processes, electronic devices, and electronic device manufacturing methods described.

We claim:

1. An integrated circuit comprising a plurality of thin film layers, one of said layers comprising a high dielectric constant insulator comprising a metal oxide including the metals lead, zirconium, titanium, and tin.

2. An integrated circuit as in claim 1 wherein the molecular proportion of tin in said metal oxide ranges from 30% to 50% of the total amount of tin, zirconium and titanium in said metal oxide.

3. An integrated circuit as in claim 2 wherein said metal-oxide comprises a material having the chemical formula $Pb_xSn_yZr_zTi_{1-(y+z)}O_3$, where x=1 to 1.1, y=0.30 to 0.50, and z=0.15 to 0.35.

4. An integrated circuit as in claim 2 wherein said layer of metal oxide has a thickness ranging from 1000 angstroms to 5000 angstroms.

5. An integrated circuit as in claim 2 wherein said integrated circuit includes a capacitor having a first electrode, a second electrode, and a dielectric between said first and second electrodes, and wherein said dielectric comprises said metal-oxide.

6. An integrated circuit as in claim 5 wherein said integrated circuit comprises a memory cell which includes said capacitor.

7. An integrated circuit as in claim 2 wherein said one of said thin film layers is contained in a charge storage device.

8. An integrated circuit as in claim 7 wherein said charge storage device comprises a memory cell.

9. An integrated circuit as in claim 2 wherein said one of said thin film layers is contained in an MMIC.

* * * * *